(12) United States Patent
Wen

(10) Patent No.: US 7,682,960 B2
(45) Date of Patent: Mar. 23, 2010

(54) METHOD OF FABRICATING A WAFER STRUCTURE HAVING A PAD AND A FIRST PROTECTION LAYER AND A SECOND PROTECTION LAYER

(75) Inventor: Shau-Chuo Wen, Kaohsiung (TW)

(73) Assignee: Advanced Semiconductor Engineering, Inc. (TW)

( * ) Notice: Subject to any disclaimer, the term of this patent is extended or adjusted under 35 U.S.C. 154(b) by 15 days.

(21) Appl. No.: 12/073,833

(22) Filed: Mar. 11, 2008

(65) Prior Publication Data

US 2008/0299757 A1 Dec. 4, 2008

(30) Foreign Application Priority Data

Jun. 4, 2007 (TW) .............................. 96119957 A

(51) Int. Cl.
*H01L 21/44* (2006.01)
(52) U.S. Cl. ................ 438/612; 438/613; 257/E21.508
(58) Field of Classification Search ................ 438/612, 438/613, 108; 257/737, E23.021, E21.508
See application file for complete search history.

(56) References Cited

U.S. PATENT DOCUMENTS

| 6,077,726 | A | 6/2000 | Mistry et al. |
| 6,703,069 | B1 * | 3/2004 | Moon et al. .................. 427/123 |
| 6,924,553 | B2 * | 8/2005 | Ohara ........................ 257/738 |
| 7,176,583 | B2 * | 2/2007 | Daubenspeck et al. ...... 257/781 |

* cited by examiner

*Primary Examiner*—Khiem D Nguyen
(74) *Attorney, Agent, or Firm*—Bacon & Thomas, PLLC

(57) ABSTRACT

A wafer structure and a method for fabricating the same are provided. First, a wafer having a pad and a first protection layer with a first opening is provided. Next, a second protection layer with a second opening is formed on the first protection layer. Part of the pad and the first protection layer are exposed from the openings. The edges of the openings construct a step structure. Following that, an adhesion layer is formed on the pad, the step structure and the second protection layer. Afterwards, a photo-resist layer with a third opening is formed on the adhesion layer. Then, a barrier layer is electroplated onto part of the adhesion layer. Further, a wetting layer is formed on the barrier layer, and then the photo-resist layer and part of the adhesion layer exposed outside the barrier layer are removed. Finally, a solder layer is printed onto the wetting layer.

16 Claims, 8 Drawing Sheets

METHOD OF FABRICATING A WAFER STRUCTURE HAVING A PAD AND A FIRST PROTECTION LAYER AND A SECOND PROTECTION LAYER

This application claims the benefit of Taiwan application Ser. No. 96119957, filed Jun. 4, 2007, the subject matter of which is incorporated herein by reference.

BACKGROUND OF THE INVENTION

1. Field of the Invention

The invention relates in general to a wafer structure and a method for fabricating the same, and more particularly to a wafer structure having an electroplated layer and a method for fabricating the same.

2. Description of the Related Art

As electronic products become more and more popular in the market, more functions are provided into the products to meet consumers' demands. Along with the developing of multifunctional electronic products, more and more semiconductor packages are needed in the products. However, due to the miniaturization of volume and size of the products, semiconductor packages are facing severe tests with regard to heat dissipation and operational stability. Therefore, the quality of semiconductor packages becomes one of the crucial factors for maintaining product stability.

Of the semiconductor packaging technologies, examples of commonly used chip bonding technologies include flip-chip bonding, wire bonding and tape automated bonding. By way of these chip bonding technologies, the chips and the substrates are electrically connected. Among these bonding technologies, flip-chip bonding uses solder bumps as a connecting medium between the chip and the substrate. Compared with other bonding technologies, namely wire bonding and tape automated bonding, flip-chip bonding has the virtue of shorter electrical path and better quality in electrical connection, and therefore becomes an important research and development field for the manufacturers.

Generally, a wafer structure applied in the fabricating process of the semiconductor package includes a wafer, an under bump metallurgy (UBM) layer and a solder bump. The surface of the wafer has an electrical pad used as a terminal of electrical connection. The surface of the wafer is further covered and protected by a passivation layer. The passivation layer exposes part of the electrical pad. The UBM layer is normally sputtered on the pad and covers part of the passivation layer, so that the solder bump will not contact the electrical pad directly. The solder bump is disposed on the UBM layer. Normally, when performing the manufacturing steps with respect to heat treatment, such as the process of reflowing a solder layer to form the solder bump, thermal stress is generated between the material layers of the wafer structure. The passivation layer is usually relatively thin and susceptible to the stress, and therefore may easily crack. Under such circumstance, the solder material of the solder layer will contact the electrical pad via the damaged passivation layer and directly jeopardize the quality of semiconductor package.

In recent years, manufacturers have provided a wafer structure which forms a polymer layer on the passivation layer to avoid deteriorating of quality causing by the crack of the passivation layer. However, the way of stacking the polymer layer with the passivation layer makes the stacking of the UBM layer at the edges of the polymer layer and the passivation layer even more difficult. When the UBM layer is sputtered on the electrical pad, the improper stacking may easily occur at the edges of the polymer layer and the passivation layer. Referring to FIG. 1, a perspective of conventional UBM layer having improper stacking is shown. The passivation layer 13 is disposed on the wafer 11. The polymer layer 15 is disposed on the passivation layer 13. An indent 16(1) is formed between the edge of the passivation layer 13 and the edge of the wafer 11, and another indent 16(2) is formed between the edge of the polymer layer 15 and the edge of the passivation layer 13. When the UBM layer 17 is sputtered on the polymer layer 15, the passivation layer 13 and the wafer 11, improper stacking may easily occur at the indents 16(1) and 16(2) and affect the quality of the bonding between the solder bump and electrical pad. To the worse, the materials of the electrical pad and the solder bump may even spread into one another at the location of improper stacking, making the solder bump brittle or making the metallic material of the electrical pad generate metal void defect.

SUMMARY OF THE INVENTION

The invention is directed to a wafer structure and a method for fabricating the same. At least one material layer in the UBM layer is formed by way of electroplating process, so that the UBM layer can completely cover the wafer, hence improving the yield rate and quality of the bonding between the bump and the pad.

According to a first aspect of the present invention, a method of fabricating a wafer structure is provided. First, a wafer having a pad and a first protection layer covering the wafer is provided. The first protection layer having a first opening that exposes part of the pad. Next, a second protection layer is formed on the first protection layer. The second protection layer has a second opening that exposes part of the pad and the first protection layer. The second opening is larger than the first opening, and the edges of the first opening and the second opening construct a step structure. Furthermore, an adhesion layer is formed on the pad, the step structure and the second protection layer. Afterwards, a photo-resist layer is formed on the adhesion layer. The photo-resist layer has a third opening that located over the pad and exposing part of the adhesion layer. Following that, a barrier layer is electroplated onto the adhesion layer by using an electroplating solution, so that the barrier layer completely covers the exposed part of the adhesion layer. The barrier layer and the third opening substantially have a same width. After that, a wetting layer is formed on the barrier layer. Next, the photo-resist layer and part of the adhesion layer exposed outside the barrier layer are removed. Finally, a solder layer is printed on the wetting layer.

According to a second aspect of the present invention, a method of fabricating a wafer structure is provided. First, a wafer having a pad and a first protection layer covering the wafer is provided. The first protection layer has a first opening that exposes part of the pad. Next, a second protection layer is formed on the first protection layer. The second protection layer has a second opening that exposes part of the pad and the first protection layer. The second opening is larger than the first opening, and the edges of the first opening and the second opening construct a step structure. Following that, an adhesion layer completely covering the pad, the step structure and the second protection layer is formed. Afterwards, a barrier layer is electroplated onto the adhesion layer by using an electroplating solution. After that, a wetting layer completely covering the barrier layer is formed. Furthermore, a photo-resist layer is formed on the wetting layer. The photo-resist layer covers part of the wetting layer and is substantially located over the pad and the step structure. Afterwards, the wetting layer, the barrier layer and the adhesion layer exposed outside the photo-resist layer are removed. Following that, the photo-resist layer is removed. Finally, a solder layer is printed on the wetting layer.

According to a third aspect of the present invention, a wafer structure including a wafer, a second protection layer, an UBM layer and a bump is provided. The wafer has a pad and a first protection layer covering the wafer. The first protection layer has a first opening that exposes part of the pad. The second protection layer is disposed on the first protection layer. The second protection layer has a second opening that exposes part of the pad and the first protection layer. The second opening is larger than the first opening, and the edges of the first opening and the second opening construct a step structure. The UBM layer includes an adhesion layer, a barrier layer and a wetting layer. The adhesion layer is disposed on the pad, the step structure and the second protection layer. The barrier layer being an electroplated layer is disposed on the adhesion layer. The barrier layer has a planar top surface and thus forms a T-plug. The wetting layer is disposed on the barrier layer. The adhesion layer, the barrier layer and the wetting layer have a same width. The bump is disposed on the UBM layer.

According to a fourth aspect of the present invention, a wafer structure including a wafer, a second protection layer, an UBM layer and a bump is provided. The wafer has a pad and a first protection layer covering the wafer. The first protection layer has a first opening that exposes part of the pad. The second protection layer disposed on the first protection layer has a second opening that exposes part of the pad and the first protection layer. The second opening is larger than the first opening, and the edges of the first opening and the second opening construct a step structure. The UBM layer includes an adhesion layer, a barrier layer and a wetting layer. The adhesion layer is disposed on the pad, the step structure and the second protection layer. The barrier layer being an electroplated layer is disposed on the adhesion layer. The barrier layer has a curved top surface and thus forms a U-plug. The wetting layer is disposed on the barrier layer. The adhesion layer, the barrier layer and the wetting layer have a same width. The bump is disposed on the UBM layer.

According to a fifth aspect of the present invention, a wafer structure including a wafer, a second protection layer, an UBM layer and a bump is provided. The wafer has a pad and a first protection layer covering the wafer. The first protection layer has a first opening that exposes part of the pad. The second protection layer is disposed on the first protection layer. The second protection layer has a second opening that exposes part of the pad and the first protection layer. The second opening is larger than the first opening, and the edges of the first opening and the second opening construct a step structure. The UBM layer includes an adhesion layer, a barrier layer and a wetting layer. The adhesion layer is disposed on the pad, the step structure and the second protection layer. The barrier layer being an electroplated layer is disposed on the adhesion layer. The wetting layer being another electroplated layer is disposed on the barrier layer. The wetting layer has a planar top surface and thus forms a T-plug. The adhesion layer, the barrier layer and the wetting layer have a same width. The bump is disposed on the UBM layer.

According to a sixth aspect of the present invention, a wafer structure including a wafer, a second protection layer, an UBM layer and a bump is provided. The wafer has a pad and a first protection layer covering the wafer. The first protection layer has a first opening that exposes part of the pad. The second protection layer is disposed on the first protection layer, and has a second opening that exposes part of the pad and the first protection layer. The second opening is larger than the first opening, and the edges of the first opening and the second opening construct a step structure. The UBM layer includes an adhesion layer, a barrier layer and a wetting layer. The adhesion layer is disposed on the pad, the step structure and the second protection layer. The barrier layer being an electroplated is disposed on the adhesion layer. The wetting layer being another electroplated layer is disposed on the barrier layer. The wetting layer has a curved top surface and thus forms a U-plug. The adhesion layer, the barrier layer and the wetting layer have a same width. The bump is disposed on the UBM layer.

The invention will become apparent from the following detailed description of the preferred but non-limiting embodiments. The following description is made with reference to the accompanying drawings.

DETAILED DESCRIPTION OF THE INVENTION

Figure 1:
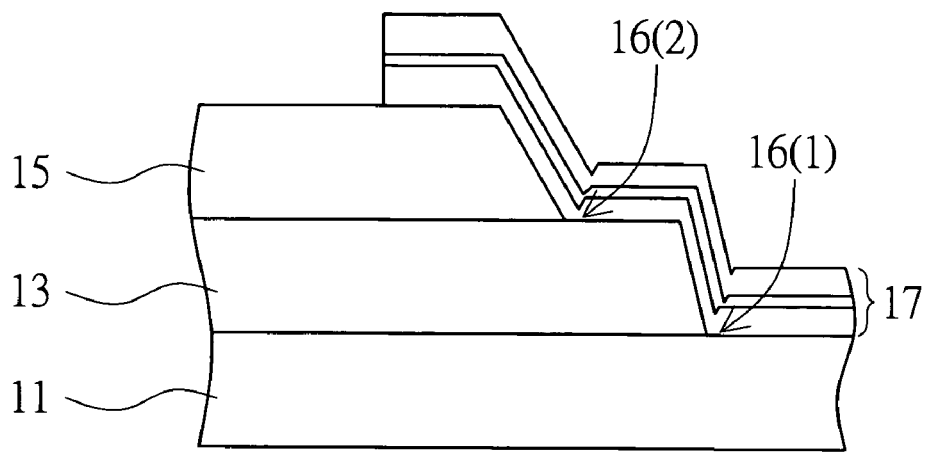
FIG. 1 (Prior Art) is a perspective of conventional UBM layer having improper stacking.

The invention is exemplified by the following preferred embodiments. The main difference among these embodiments lies in the manner of forming the UBM layer and the material layer for forming the plug. However, these embodiments are for the purpose of exemplification and are not for limiting the scope of protection of the invention, and these embodiments are accorded with the appended claims. Furthermore, unnecessary elements are omitted in the drawings of the embodiments, so as to clearly show the technical characteristics of the invention.

First Embodiment

Figure 2A:
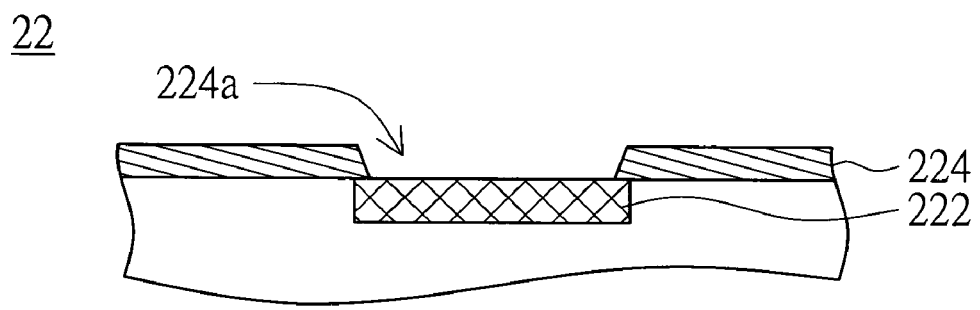
FIG. 2A is a perspective of a wafer according to a first embodiment of the invention.
Figure 2B:
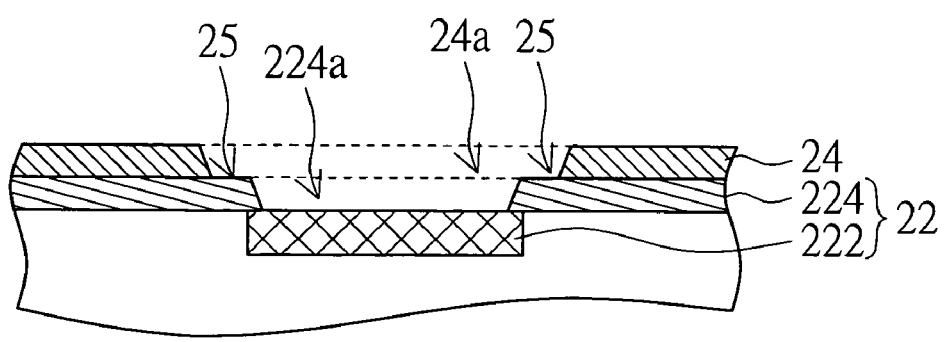
FIG. 2B is a perspective of a second protection layer formed on the first protection layer in FIG. 2A.
Figure 2C:
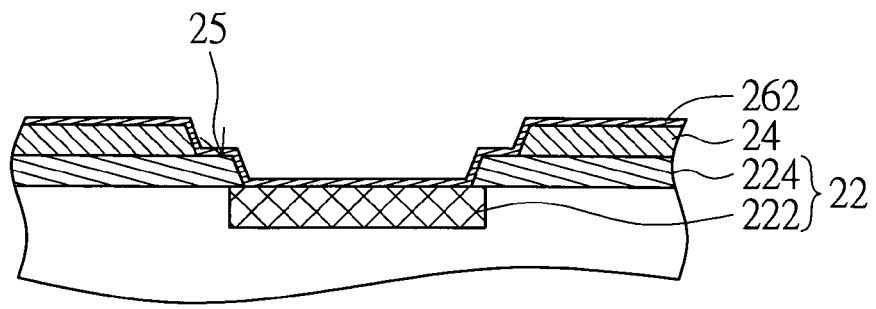
FIG. 2C is a perspective of an adhesion layer formed on the wafer and the second protection layer in FIG. 2B.
Figure 2D:
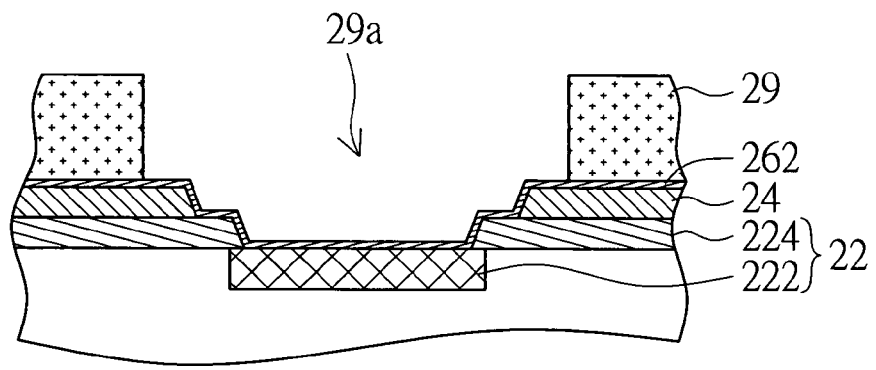
FIG. 2D is a perspective of a photo-resist layer formed on the adhesion layer in FIG. 2C.
Figure 2E:
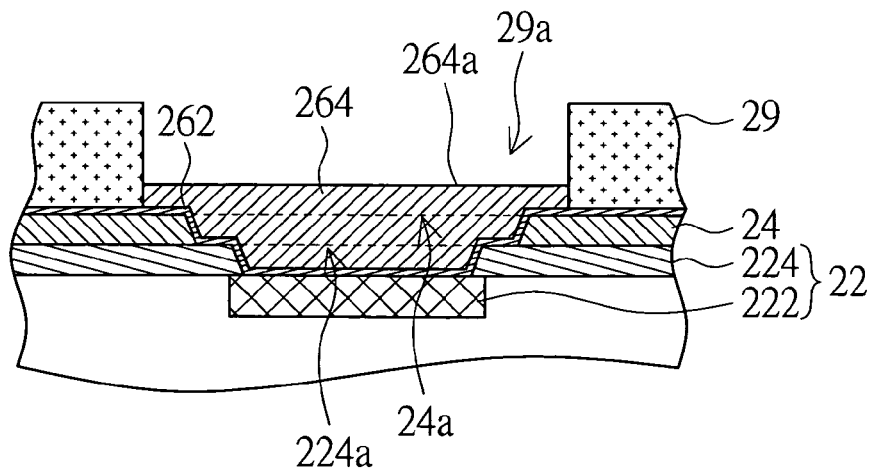
FIG. 2E is a perspective of a barrier layer electroplated onto the adhesion layer in FIG. 2D.
Figure 2F:
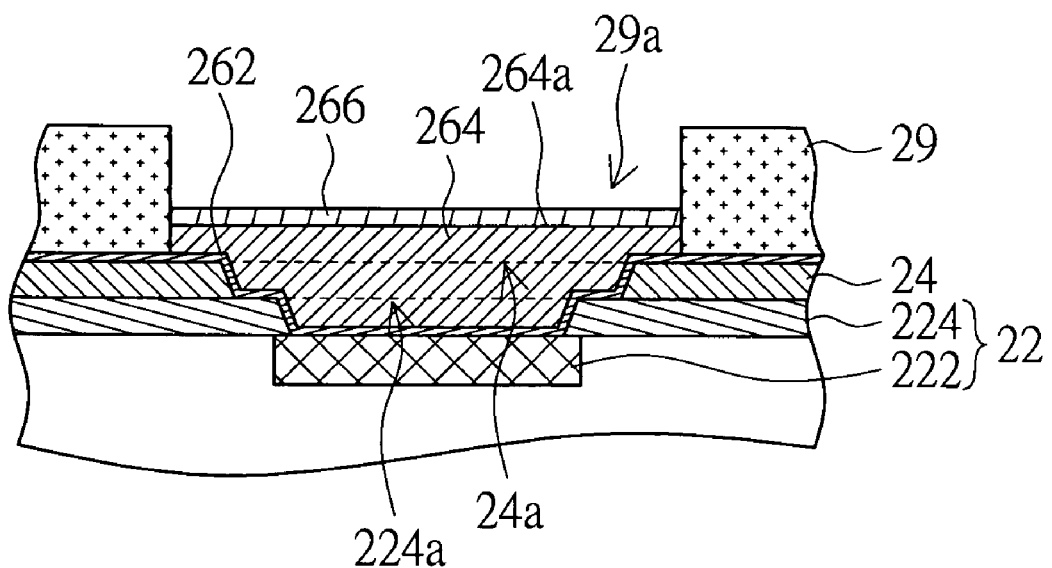
FIG. 2F is a perspective of a wetting layer formed on the barrier layer in FIG. 2E.
Figure 2G:
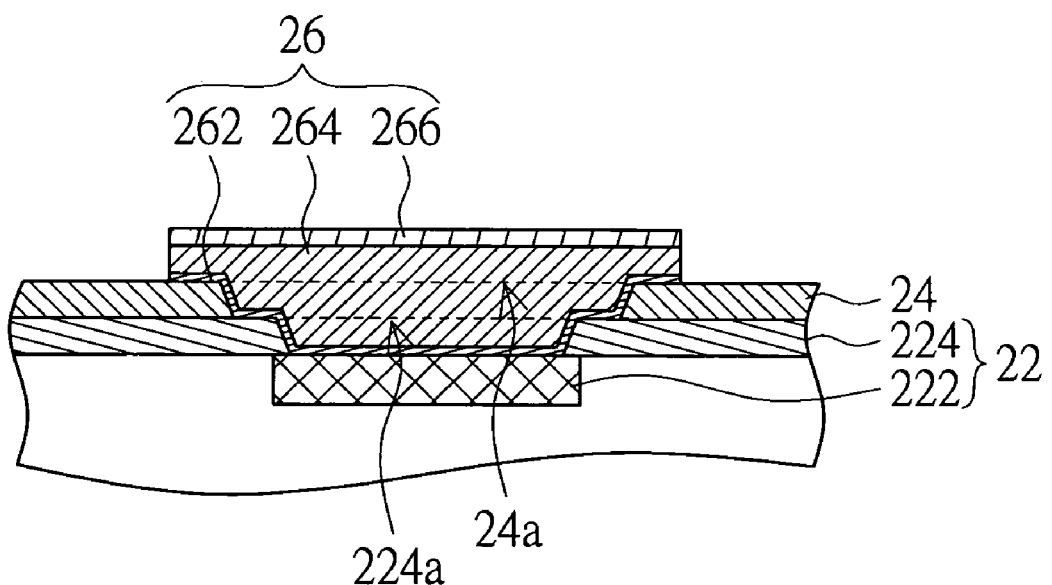
FIG. 2G is a perspective after the photo-resist layer and part of the adhesion layer in FIG. 2F are removed.

Please refer to FIG. 2A~2G at the same time. FIG. 2A is a perspective of a wafer according to a first embodiment of the invention. FIG. 2B is a perspective of a second protection layer formed on the first protection layer in FIG. 2A. FIG. 2C is a perspective of an adhesion layer formed on the wafer and the second protection layer in FIG. 2B. FIG. 2D is a perspective of a photo-resist layer formed on the adhesion layer in FIG. 2C. FIG. 2E is a perspective of a barrier layer electroplated onto the adhesion layer in FIG. 2D. FIG. 2F is a perspective of a wetting layer formed on the barrier layer in FIG. 2E. FIG. 2G is a perspective after the photo-resist layer and part of the adhesion layer in FIG. 2F are removed.

The method of fabricating a wafer structure according to a first embodiment of the invention includes the following steps. First, a wafer 22 having a pad 222 and a first protection layer 224 is provided. The first protection layer 224 covers the wafer 22 and has a first opening 224a that exposes part of the pad 222, as indicated in FIG. 2A. The pad 222 is normally made of metal, such as aluminum or copper. In the present embodiment of the invention, the material of the pad 222 is exemplified by aluminum. The first protection layer 224 is preferably a passivation layer on the surface of the wafer 22.

Then, as indicated in FIG. 2B, a second protection layer 24 is formed on the first protection layer 224. The second protection layer 24 has a second opening 24a that exposes part of the pad 222 and the first protection layer 224. The second opening 24a is larger than the first opening 224a, and the edges of the first opening 224a and the second opening 24a construct a step structure 25. The second protection layer 24 is preferably a polymer layer commonly made of benzocyclo-butene (BCB), poly-imide (PI) or poly-benzo-oxazole (PBO). The second protection layer 24 may also referred to as a repassivation layer that is disposed on the surface of the wafer 22 for buffering the stress generated from the first protection layer 224.

Next, an adhesion layer 262 is formed on the pad 222, the step structure 25 and the second protection layer 24, as indicated in FIG. 2C. In the present embodiment of the invention, the adhesion layer 262 is formed through sputtering or electroless-plating process for example. The adhesion layer 262 is made of aluminum (Al) or other materials commonly used in the related art, such as chromium (Cr) or tungsten-titanium alloy (TiW).

Furthermore, as indicated in FIG. 2D, a photo-resist layer 29 is formed on the adhesion layer 262. The photo-resist layer 29 has a third opening 29a located over the pad 222 and exposing part of the adhesion layer 262.

Afterwards, a barrier layer 264 is electroplated onto the adhesion layer 262 by using an electroplating solution, thus making the barrier layer 264 completely cover the exposed part of the adhesion layer 262. Furthermore, the barrier layer 264 completely covers the part of the adhesion layer 262 that exposed outside the third opening 29a, and the barrier layer 264 and the third opening 29a substantially have a same width, as indicated in FIG. 2E. In the present embodiment of the invention, the barrier layer 264 completely fills the first opening 224a and the second opening 24a, and part of the barrier layer 264 covers the second protection layer 24 and the step structure 25. In the present embodiment, a top surface 264a of the barrier layer 264 is a substantially planar surface, and the barrier layer 264 forms a T-plug. The barrier layer 264 is made of nickel-vanadium alloy (NiV) or other materials commonly used in related art, such as chromium copper alloy (CrCu), copper, nickel or tungsten-titanium alloy.

After that, a wetting layer 266 is formed on the barrier layer 264. The wetting layer 266 substantially has a same width as the third opening 29a, as indicated in FIG. 2F. In the present embodiment of the invention, the wetting layer 266 is sputtered or electroplated onto the barrier layer 264 for example. Because the top surface 264a of the barrier layer 264 is a planar surface, the entire wetting layer 266 forms a plane accordingly. In the present embodiment of the invention, the wetting layer 266 is made of copper (Cu) or other materials commonly used in the related art, such as nickel (Ni) or gold (Au).

Following that, the photo-resist layer 29 is removed, and part of the adhesion layer 262 that is exposed outside the barrier layer 264 is removed by way of anisotropic etching process. Therefore, the adhesion layer 262, the barrier layer 264 and the wetting layer 266 then preferably have a same width as indicated in FIG. 2G. The adhesion layer 262, the barrier layer 264 and the wetting layer 266 construct an under bump metallurgy layer (UBM layer) 26.

After that, the fabricating method of the present embodiment proceeds to the step of printing a solder layer on the wetting layer 266. The solder layer preferably has a same width as the UBM layer 26, and is commonly made of tin (Sn), lead (Pb), silver (Ag), gold, copper or combinations thereof. After the solder layer is printed, the solder layer is reflown to form a bump.

Figure 3A:
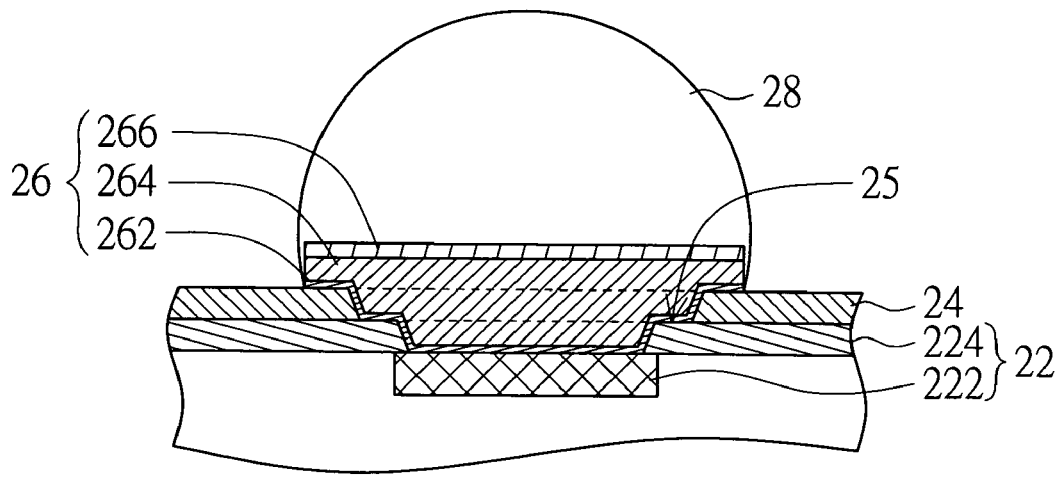
FIG. 3A is a perspective of a wafer structure according to a first embodiment of the invention.

After the bump is formed on the wetting layer 266, the wafer structure according to the present embodiment of the invention is completed. Referring to FIG. 3A, a perspective of a wafer structure according to a first embodiment of the invention is shown. The wafer structure 20 includes a wafer 22, a second protection layer 24, a UBM layer 26 and a bump 28. The UBM layer 26 is constructed by the adhesion layer 262, the barrier layer 264 and the wetting layer 266. In the present embodiment of the invention, the barrier layer 264 is an electroplated layer and forms a T-plug, so that the UBM layer 26 properly covers the pad 222, the second protection layer 24 and the step structure 25. The stacking ability of the UBM layer 26 is improved, thus further increasing the reliability of the bonding between the bump 28 and the pad 222 as well as the yield rate of the manufacturing process.

Figure 3B:
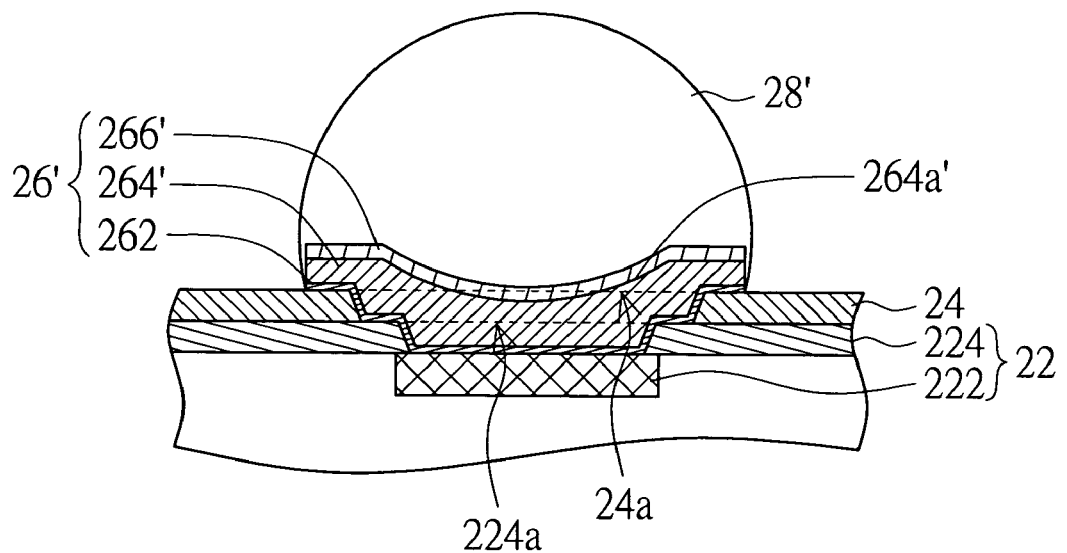
FIG. 3B is a perspective of a top surface of the barrier layer in FIG. 3A being a curved surface.

On the other hand, in the method of a fabricating wafer structure according to the present embodiment of the invention, the top surface 264a of the barrier layer 264 can also be a curved surface. Referring to FIG. 3B, a perspective of a top surface of the barrier layer of FIG. 3A being a curved surface is shown. In the UBM layer 26', the barrier layer 264' incompletely fills the first opening 224a and the second opening 24a, so that a curve is formed on the top surface 264a' of the barrier layer 264', hence saving the amount of the material of the barrier layer 264'. The barrier layer 264 forms a U-plug, and the wetting layer 266' forms a curved layer. As indicated in FIG. 3A and FIG. 3B, the wafer structures 20 and 20' fabricated via the fabricating method of the present embodiment of the invention can adjust the amount of the solder used for forming the bumps 28 and 28' by electroplating different amount of barrier layers 264 and 264' in accordance with the needs of different manufacturing processes.

Second Embodiment

The present embodiment of the invention differs from the first embodiment in that the T-plug or the U-plug is formed by the wetting layer. Besides that, the method of fabricating wafer structure according to the second embodiment of the invention also sets out from the steps of providing a wafer, forming a second protection layer, forming an adhesion layer and forming a photo-resist layer. These steps are similar to those of the first embodiment, as indicated in FIG. 2A~2D, and are repeated here.

Figure 4A:
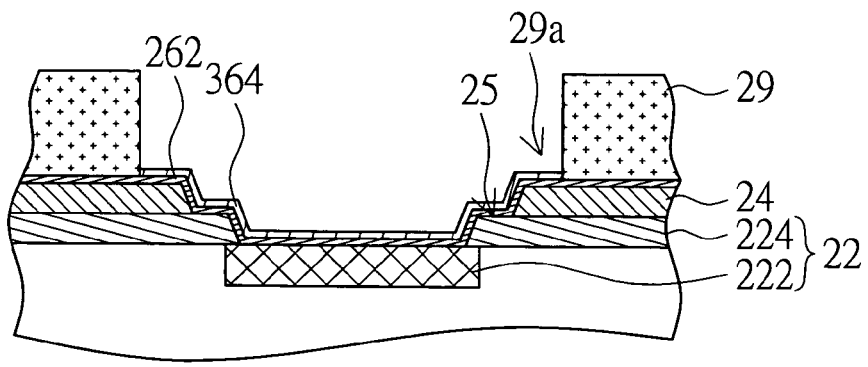
FIG. 4A is a perspective of a barrier layer being formed on the adhesion layer according to a second embodiment of the invention.
Figure 4B:
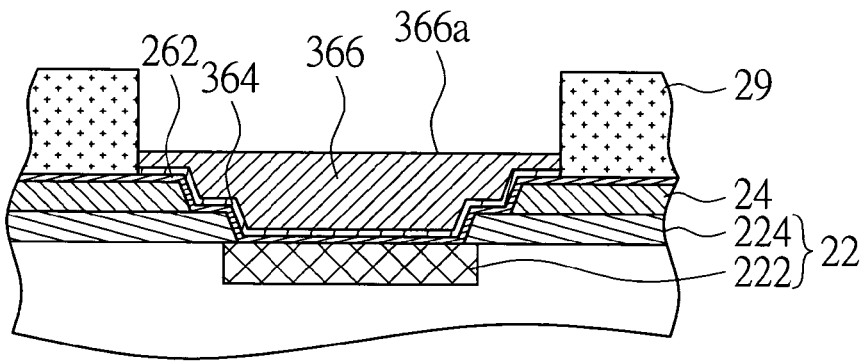
FIG. 4B is a perspective of a wetting layer being formed on the barrier layer in FIG. 4A.

Please refer to both FIGS. 4A and 4B. FIG. 4A is a perspective of a barrier layer being formed on the adhesion layer according to a second embodiment of the invention. FIG. 4B is a perspective of a wetting layer being formed on the barrier layer of FIG. 4A. After performing the forming steps mentioned in the above, the fabricating method of the present embodiment of the invention then proceeds to the step of electroplating the barrier layer. As indicated in FIG. 4A, a barrier layer 364 is electroplated onto the adhesion layer 262 by using an electroplating solution. The barrier layer 364 completely covers the exposed part of the adhesion layer 262, and substantially has a same width as the third opening 29a.

Following that, a wetting layer 366 is formed on the barrier layer 364. The wetting layer 366 substantially has a same width as the third opening 29a, as indicated in FIG. 4B. In the present embodiment of the invention, the wetting layer 366 is preferably formed on the barrier layer 364 through an electroplating process. Part of the wetting layer 366 covers the second protection layer 24 and the step structure 25. The wetting layer 366 has a planar top surface 366a, and the wetting layer 366 forms a T-plug.

Next, the photo-resist layer 29 is removed. Then, the part of the adhesion layer 262 that is not covered by the barrier layer 364 is removed through an anisotropic etching process, so that the adhesion layer 262, the barrier layer 364 and the wetting layer 366 have substantially a same width. After that, a bump is formed by printing and reflowing the solder layer.

Figure 5:
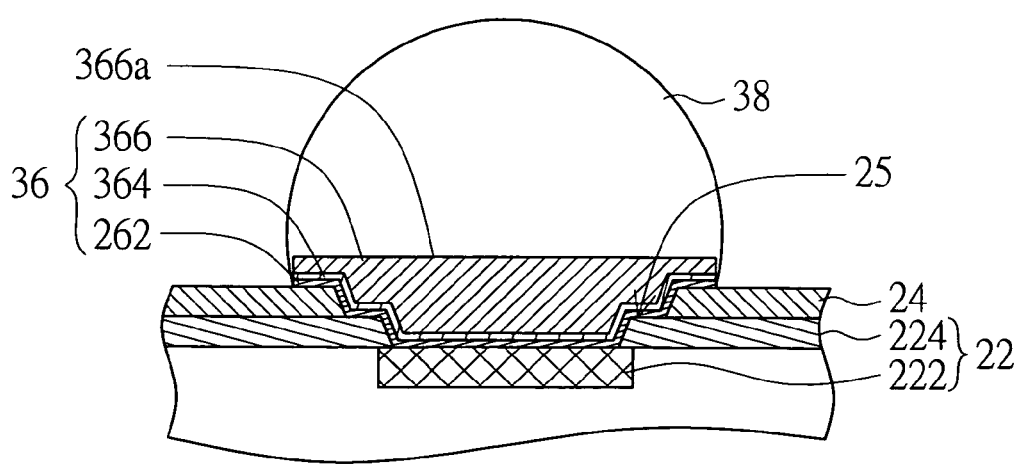
FIG. 5 is a wafer structure according to a second embodiment of the invention.

After the bump is formed on the wetting layer 366, the wafer structure according to the present embodiment of the invention is completed. Referring to FIG. 5, a perspective of a wafer structure according to a second embodiment of the invention is shown. The wafer structure 30 includes a wafer 22, a second protection layer 24, an UBM layer 36 and a bump 38. The UBM layer 36 is constructed by the adhesion layer 262, the barrier layer 364 and the wetting layer 366. In the present embodiment of the invention, the barrier layer 364 and the wetting layer 366 are formed through electroplating processes. The T-plug is formed by the wetting layer 366, thus making the UBM layer 36 completely cover the pad 222, the step structure 25 and the second protection layer 24, and therefore the stacking ability of the UBM layer 36 is improved.

Besides, in the method of fabricating the wafer structure according to the present embodiment of the invention, the amount of the material for forming the wetting layer 366 can be reduced during the electroplating process to make the top surface 366a form a curved surface, such that the wetting layer 366 forms a U-plug accordingly. In this manner, the amount of solder used for forming the bump 38 can be changed in accordance with the needs of different manufacturing processes.

Third Embodiment

Figure 6A:
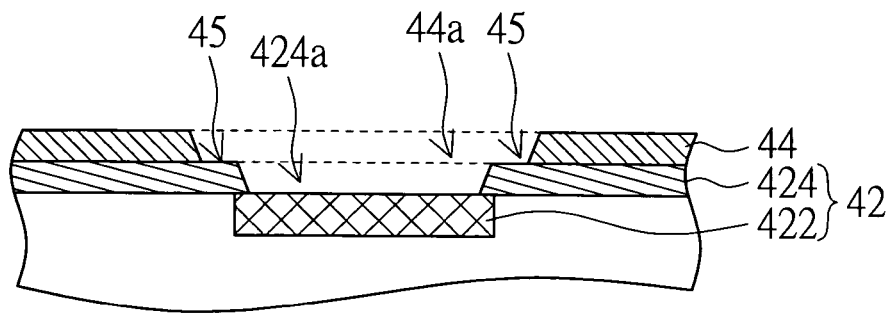
FIG. 6A is a perspective of a wafer and a second protection layer according to a third embodiment of the invention.
Figure 6B:
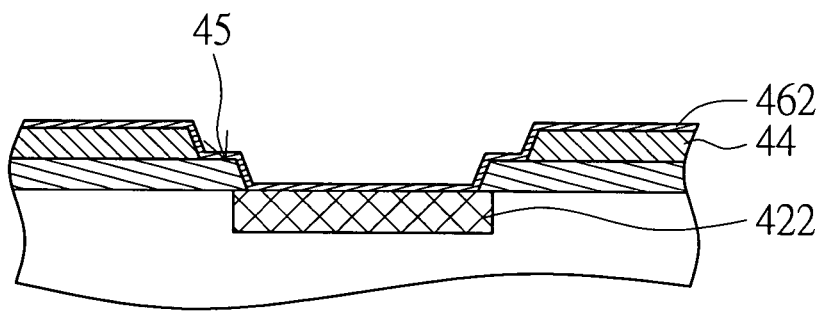
FIG. 6B is a perspective of an adhesion layer being formed on the wafer and the second protection layer in FIG. 6A.
Figure 6C:
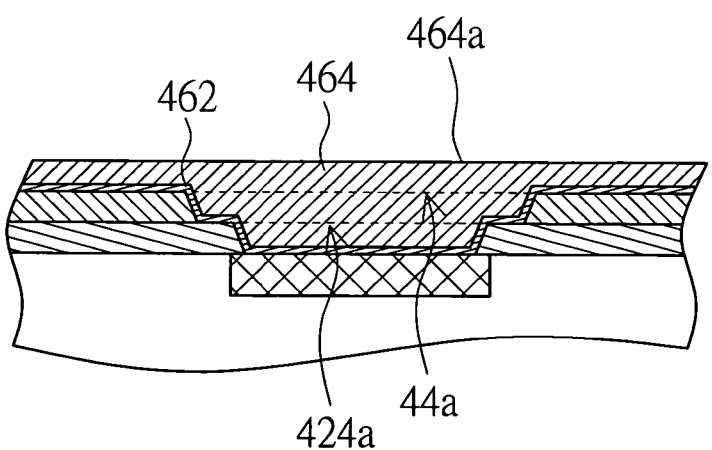
FIG. 6C is a perspective of a barrier layer being formed on the adhesion layer in FIG. 6B.
Figure 6D:
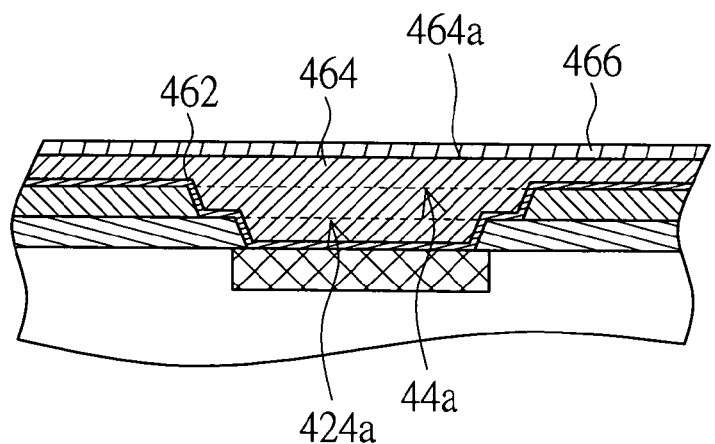
FIG. 6D is a perspective of a wetting layer being formed on the barrier layer in FIG. 6C.
Figure 6E:
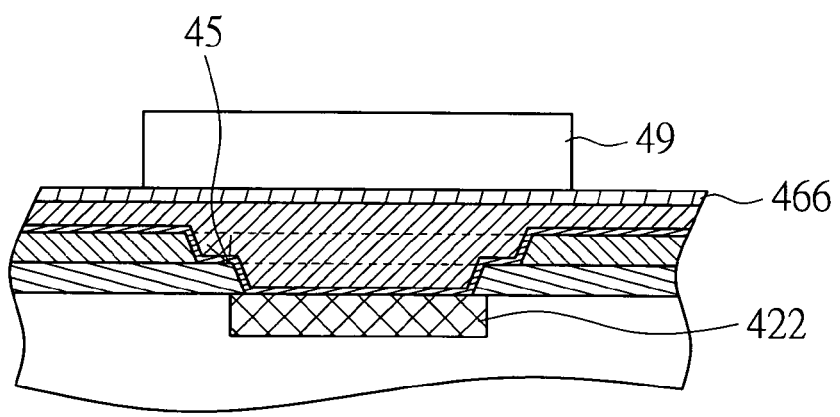
FIG. 6E is a photo-resist layer being formed on the wetting layer in FIG. 6D.
Figure 6F:
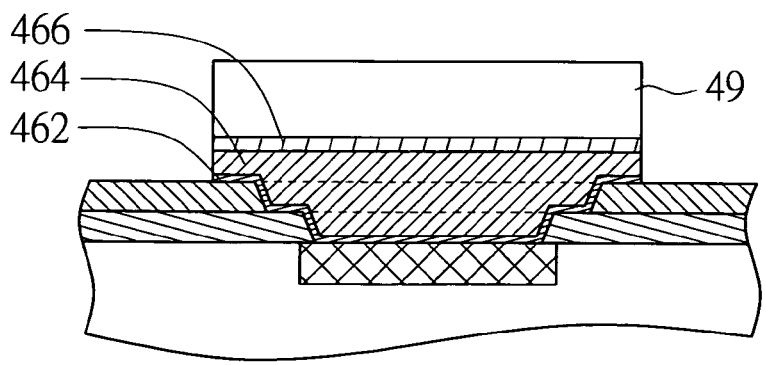
FIG. 6F is perspective after the part of the wetting layer, the barrier layer and the adhesion layer exposed outside the photo-resist layer in FIG. 6E are removed.
Figure 6G:
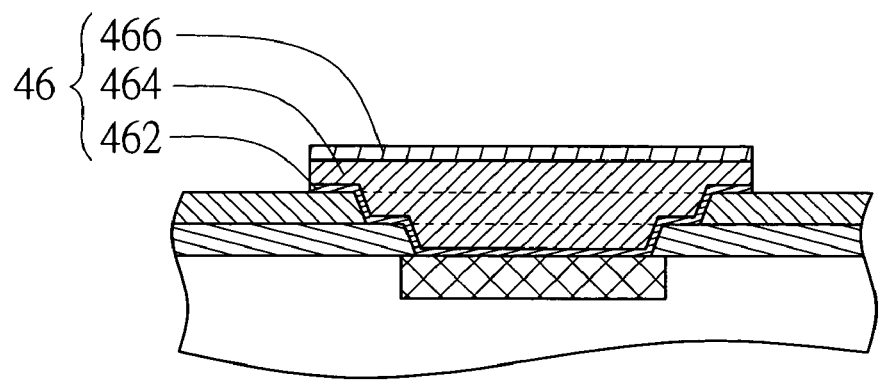
FIG. 6G is a perspective after the photo-resist layer in FIG. 6F is removed.

The present embodiment of the invention differs from the first embodiment in the disposition of the photo-resist layer and in the way of forming the UBM layer. Other similarities are not repeated here. Please refer to FIG. 6A~6G. FIG. 6A is a perspective of a wafer and a second protection layer according to a third embodiment of the invention. FIG. 6B is a perspective of an adhesion layer being formed on the wafer and the second protection layer in FIG. 6A. FIG. 6C is a perspective of a barrier layer being formed on the adhesion layer in FIG. 6B. FIG. 6D is a perspective of a wetting layer being formed on the barrier layer in FIG. 6C. FIG. 6E is a photo-resist layer being formed on the wetting layer in FIG. 6D. FIG. 6F is perspective after the part of the wetting layer, the barrier layer and the adhesion layer exposed outside the photo-resist layer in FIG. 6E are removed. FIG. 6G is a perspective after the photo-resist layer in FIG. 6F.

The method of fabricating wafer structure according to the third embodiment of the invention includes the following steps. First, a wafer 42 having a pad 422 and a first protection layer 424 is provided. The first protection layer 424 covers the wafer 42 and has a first opening 424a that exposes part of the pad 422. Then a second protection layer 44 is formed on the first protection layer 424 as indicated in FIG. 6A. The second protection layer 44 has a second opening 44a that exposes part of the pad 422 and the first protection layer 424. The second opening 44a is larger than the first opening 424a, and the edges of the first opening 424a and the second opening 44a construct a step structure 45.

Next, an adhesion layer 462 completely covering the pad 422, the step structure 45 and the second protection layer 44 is formed. In the present embodiment, the adhesion layer 462 is formed through a sputtering or an electroless-plating process.

Following that, a barrier layer 464 is electroplated onto the adhesion layer 462 by using an electroplating solution, and the barrier layer 464 completely covers thereon. In the present embodiment, the barrier layer 464 completely fills the first opening 424a and the second opening 44a. The barrier layer 464 has a planar top surface 464a and thus forms a T-plug, as indicated in FIG. 6C.

After that, a wetting layer 466 is formed on the barrier layer 464 as indicated in FIG. 6D. In the present embodiment, the wetting layer 466 is formed on the barrier layer 464 through a sputtering or an electroplating process. The wetting layer 466 on the planar top surface 464a forms a planar layer correspondingly.

Furthermore, a photo-resist layer 49 is formed on the wetting layer 466, as indicated in FIG. 6E. The photo-resist layer 49 covers part of the wetting layer 466 and is substantially located over the pad 422 and the step structure 45.

Afterwards, as indicated in FIG. 6F and FIG. 6G, the wetting layer 466, the barrier layer 464 and the adhesion layer 462 exposed outside the photo-resist layer 49 is removed through an anisotropic etching process, so that the wetting layer 466, the barrier layer 464 and the adhesion layer 462 have substantially a same width. The adhesion layer 462, the barrier layer 464 and the wetting layer 466 construct an UBM layer 46.

Next, the photo-resist layer 49 is removed.

Figure 7:
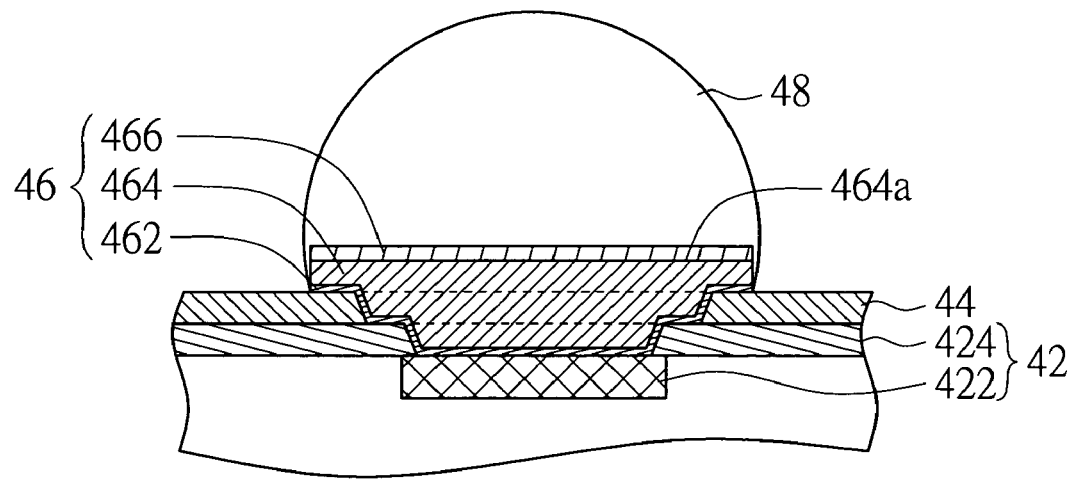
FIG. 7 is a perspective of a wafer structure formed according to a fabricating method according to a third embodiment of the invention.

After that, a solder layer is printed on the wetting layer 466, and then reflowing the solder layer to form a bump. After the bump is formed on the wetting layer 466, the wafer structure according to the present embodiment of the invention is completed. Referring to FIG. 7, a perspective of a wafer structure formed according to a fabricating method according to a third embodiment of the invention is shown. The wafer structure 40 includes a wafer 42, a second protection layer 44, an UBM layer 46 and a bump 48. The UBM layer 46 is constructed by the adhesion layer 462, the barrier layer 464 and the wetting layer 466. The barrier layer 464 forms a T-plug through an electroplating process in the present embodiment; thus the UBM layer 46 is able to properly cover the pad 422, the step structure 45 and the second protection layer 44.

On the other hand, the top surface 464a of the barrier layer 464 can also be a curved surface, as in the first embodiment of the invention. Thus, the barrier layer 464 on the curved top surface 464a forms a U-plug correspondingly. Besides that, the wafer structure 40 can also form a T-plug or a U-plug by the wetting layer 466.

According to the wafer structure and the method for manufacturing the same in the above-described preferred embodiments of the invention, at least the barrier layer is an electroplated layer, and the T-plug or U-plug is formed by the barrier or the wetting layer. Therefore, the UBM layer can properly covers the pad, the step structure and the second protection layer, hence improving the stacking ability of the UBM layer, increasing the reliability of the bonding of the bump and the pad as well as the yield rate of the manufacturing process and the quality of the wafer structure. The amount of solder can be changed by forming the T-plug or the U-plug of the barrier layer or the wetting layer, making the wafer structure and the frabricating method of the invention more adapted to different fabricating processes.

While the invention has been described by way of example and in terms of a preferred embodiment, it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A method of fabricating a wafer structure, comprising:
   providing a wafer having a pad and a first protection layer covering the wafer, the first protection layer having a first opening that exposes part of the pad;
   forming a second protection layer on the first protection layer, the second protection layer having a second opening that exposes part of the pad and the first protection layer, wherein the second opening is larger than the first opening, and the edges of the first opening and the second opening construct a step structure;
   forming an adhesion layer on the pad, the step structure and the second protection layer;
   forming a photo-resist layer on the adhesion layer, wherein the photo-resist layer has a third opening located over the pad, and the third opening exposes part of the adhesion layer;
   electroplating a barrier layer onto the adhesion layer by using an electroplating solution, wherein the barrier layer completely covers the exposed part of the adhesion layer, and the barrier layer and the third opening substantially have a same width;
   forming a wetting layer on the barrier layer;
   removing the photo-resist layer;
   removing part of the adhesion layer exposed outside the barrier layer; and
   printing a solder layer on the wetting layer.

2. The fabricating method according to claim 1, wherein part of the barrier layer substantially covers the second protection layer, and the barrier layer has a top surface which is a planar surface and the barrier layer is a T-plug.

3. The fabricating method according to claim 1, wherein part of the barrier layer substantially covers the second protection layer, and the barrier layer has a top surface which is a curved surface and the barrier layer is a U-plug.

4. The fabricating method according to claim 1, wherein part of the wetting layer substantially covers the second protection layer, and the wetting layer has a top surface which is a planar surface and the wetting layer is a T-plug.

5. The fabricating method according to claim 1, wherein part of the wetting layer substantially covers the second protection layer, and the wetting layer has a top surface which is a curved surface and the wetting layer is a U-plug.

6. The fabricating method according to claim 1, wherein the adhesion layer, the barrier layer and the wetting layer construct an under bump metallurgy layer (UBM layer), and the solder layer and the UBM layer substantially have a same width, the method further comprising:
   reflowing the solder layer to form the bump.

7. The fabricating method according to claim 1, wherein the adhesion layer is sputtered or electroless-plated onto the pad, the step structure and the second protection layer.

8. The fabricating method according to claim 1, wherein the wetting layer is sputtered or electroplated onto the barrier layer.

9. A method of fabricating a wafer structure, comprising:
   providing a wafer having a pad and a first protection layer covering the wafer, the first protection layer having a first opening that exposes part of the pad;
   forming a second protection layer on the first protection layer, the second protection layer having a second opening that exposes part of the pad and the first protection layer, wherein the second opening is larger than the first opening, and the edges of the first opening and the second opening construct a step structure;
   forming an adhesion layer completely covering the pad, the step structure and the second protection layer;
   electroplating a barrier layer completely covering the adhesion layer by using an electroplating solution;
   forming a wetting layer completely covering the barrier layer;
   forming a photo-resist layer on the wetting layer, wherein the photo-resist layer covers part of the wetting layer and is substantially located over the pad and the step structure;
   removing part of the wetting layer, the barrier layer and the adhesion layer exposed outside the photo-resist layer;
   removing the photo-resist layer; and
   printing a solder layer on the wetting layer.

10. The fabricating method according to claim 9, wherein the barrier layer has a top surface which is a planar surface and the barrier layer is a T-plug.

11. The fabricating method according to claim 9, wherein the barrier layer has a top surface which is a curved surface and the barrier layer is a U-plug.

12. The fabricating method according to claim 9, wherein the wetting layer has a top surface which is a planar surface and the wetting layer is a T-plug.

13. The fabricating method according to claim 9, wherein the wetting layer has a top surface which is a curved surface and the wetting layer is a U-plug.

14. The fabricating method according to claim 9, wherein the adhesion layer, the barrier layer and the wetting layer construct an UBM layer.

15. The fabricating method according to claim 9, wherein the adhesion layer is sputtered or electroless-plated onto the pad, the step structure and the second protection layer.

16. The fabricating method according to claim 9, wherein the wetting layer is sputtered or electroplated onto the barrier layer.

* * * * *